(12) United States Patent
Tanabe et al.

(10) Patent No.: US 7,063,999 B2
(45) Date of Patent: Jun. 20, 2006

(54) THIN FILM PROCESSING METHOD AND THIN FILM PROCESSING APPARATUS INCLUDING CONTROLLING THE COOLING RATE TO CONTROL THE CRYSTAL SIZES

(75) Inventors: Hiroshi Tanabe, Tokyo (JP); Akihiko Taneda, Hiratsuka (JP)

(73) Assignees: NEC Corporation, Tokyo (JP); Sumitomo Heavy Industries, Ltd., Tokyo (JP)

( * ) Notice: Subject to any disclaimer, the term of this patent is extended or adjusted under 35 U.S.C. 154(b) by 49 days.

(21) Appl. No.: 10/275,692

(22) PCT Filed: May 10, 2001

(86) PCT No.: PCT/JP01/03908

§ 371 (c)(1),
(2), (4) Date: Jul. 2, 2003

(87) PCT Pub. No.: WO01/86705

PCT Pub. Date: Nov. 15, 2001

(65) Prior Publication Data

US 2004/0009632 A1    Jan. 15, 2004

(30) Foreign Application Priority Data

May 10, 2000    (JP)    ............... 2000-136646

(51) Int. Cl.
  *H01L 21/44*  (2006.01)
  *H01L 21/48*  (2006.01)
  *H01L 21/50*  (2006.01)
  *H01L 21/76*  (2006.01)
  *H01L 21/20*  (2006.01)

(52) U.S. Cl. ............... 438/62; 438/117; 438/482; 438/486; 438/487; 438/489

(58) Field of Classification Search ............... 438/62, 438/117, 482, 486, 487, 489
See application file for complete search history.

(56) References Cited

U.S. PATENT DOCUMENTS 5,533,040 A * 7/1996 Zhang ............... 372/25

FOREIGN PATENT DOCUMENTS

| JP | H08-148423 A  | 6/1996    |
| JP | 09293872 A1 * | 11/1997   |
| JP | H10-289876 A  | 10/1998   |
| JP | H09-063974 A  | 3/1999    |
| JP | H11-307450 A  | 11/1999   |
| JP | 2000-021776 A | 1/2000    |

* cited by examiner

Primary Examiner—William M. Brewster
(74) Attorney, Agent, or Firm—Sughrue Mion, PLLC

(57) ABSTRACT

A thin film processing method for processing the thin film by irradiating an optical beam to the thin film. A unit of the irradiation of the optical beam includes a first and a second optical pulse irradiation to the thin film, and the unit of the irradiation is carried out repeatedly to process the thin film. The first and the second optical pulse have pulse waveforms different from each other. Preferably, a unit of the irradiation of the optical beam includes the a first optical pulse irradiated to the thin film and a second optical pulse irradiated to the thin film starting substantially simultaneous with the first optical pulse irradiation. In this case, the relationship between the first and the second optical pulse satisfies (the pulse width of the first optical pulse)<(the optical pulse of the second optical pulse) and (the irradiation intensity of the first optical pulse)≧(the irradiation intensity of the second optical pulse). A silicon thin film with a small trap state density can be formed by the optical irradiation.

8 Claims, 19 Drawing Sheets

(1)

SUBSTRATE STAGE MOVEMENT on/off
POSITIONING, FOCUSING, etc. on/off
OPTICAL IRRADIATION TO SUBSTRATE on/off (2)

SUBSTRATE STAGE MOVEMENT on/off
POSITIONING, FOCUSING, etc. on/off
MASK STAGE MOVEMENT on/off
OPTICAL IRRADIATION TO SUBSTRATE on/off

ILLUSTRATIVE LASER PULSE SHAPE

THIN FILM PROCESSING METHOD AND THIN FILM PROCESSING APPARATUS INCLUDING CONTROLLING THE COOLING RATE TO CONTROL THE CRYSTAL SIZES

BACKGROUND OF THE INVENTION

1. Field of the Invention

This invention relates to a system for the formation of a silicon thin film and a good-quality semiconductor-insulating film interface. Such silicon thin films are used for crystalline silicon thin film transistors, and such semiconductor-insulating film interfaces are employed for field effect transistors. The invention also relates to a semiconductor thin film forming system by the pulsed laser exposure method. In addition, the invention relates to a system for the manufacture of driving elements or driving circuits composed of the semiconductor thin films or field effect thin film transistors for displays and sensors, for example.

2. Description of the Related Art

Typical processes for the formation of a thin film transistor (TFT) on a glass substrate are a hydrogenated amorphous silicon TFT process and a polycrystalline silicon TFT process. In the former process, the maximum temperature in a manufacture process is about 300° C., and the carrier mobility is about 1 $cm^2$/Vsec. Such a hydrogenated amorphous silicon TFT formed by the former process is used as a switching transistor of each pixel in an active matrix (AM) liquid crystal display (LCD) and is driven by a driver integrated circuit (IC, an LSI formed on a single crystal silicon substrate) arranged on the periphery of a screen. Each of the pixels of this system includes an individual switching element TFT, and this system can yield a better image quality with less crosstalk than a passive matrix LCD. In such a passive matrix LCD, an electric signal for driving the liquid crystal is supplied from a peripheral driver circuit. In contrast, the latter polycrystalline silicon TFT process can yield a carrier mobility of 30 to 100 $cm^2$/Vsec by, for example, employing a quartz substrate and performing a process at high temperatures of about 1000° C. as in the manufacture of LSIs. For example, when this process is applied to a liquid crystal display manufacture, such a high carrier mobility can yield a peripheral driver circuit on the same glass substrate concurrently with the formation of pixel TFTs for driving individual pixels. This process is therefore advantageous to minimize manufacture process costs and to downsize the resulting products. If the product should be miniaturized and should have a higher definition, a connection pitch between an AM-LCD substrate and a peripheral driver integrated circuit must be decreased. A conventional tab connection method or wire bonding method cannot significantly provide such a decreased connection pitch. However, if a process at high temperatures as in the above case is employed in the polycrystalline silicon TFT process, low softening point glasses cannot be employed. Such low softening point glasses can be employed in the hydrogenated amorphous silicon TFT process and are available at low costs. The process temperature in the polycrystalline silicon TFT process should be therefore decreased, and techniques for the formation of polycrystalline silicon films at low temperatures have been developed by utilizing a laser-induced crystallization technique.

Such a laser-induced crystallization is generally performed by a pulse laser irradiator having a configuration shown in FIG. 15. A laser light supplied from a pulse laser source 1101 reaches a silicon thin film 1107, a work, on a glass substrate 1108 via an optical path 1106. The optical path 1106 is specified by a group of optic devices including mirrors 1102, 1103, and 1105, and a beam homogenizer 1104. The beam homogenizer 1104 is arranged to uniformize spatial intensities of laser beams. Generally, because the irradiation area is smaller than that of the glass substrate 1108, the glass substrate on an X-Y stage 1109 is moved to irradiate an optional position on the substrate with a laser beam. The laser irradiation can be also performed by moving the optic device group or moving the optic device group and the stage in combination. Laser irradiation may also be carried out in a vacuum or in the high purity gas atmosphere within the vacuum chamber. When necessary, a cassette 1110 having the glass substrate with silicon thin film and a substrate carrier mechanism 1111 are provided for mechanically separating and accommodating the substrate between the cassette and the stage.

Japanese Patent Publication (JP-B) No. 7-118443 discloses a technique of irradiating an amorphous silicon thin film on an amorphous substrate with a short wavelength pulse laser light. This technique can crystallize an amorphous silicon while keeping the overall substrate from high temperatures, and can produce semiconductor elements or semiconductor integrated circuits on large substrates available at low costs. Such large substrates are required in liquid crystal displays, and such substrate available at low costs may be glasses, for example. However, as is described in the above publication, the crystallization of an amorphous silicon thin film by action of a short wavelength laser light requires an irradiation intensity of about 50 to 500 mJ/$cm^2$. However, the maximum emission output of a conventionally available pulse laser irradiator is at most about 1 J/pulse, and an area to be irradiated by a single irradiation is at most about 2 to 20 $cm^2$, by a simple conversion. For example, if the overall of a 47 cm×37 cm substrate should be crystallized by action of laser, at least 87 to 870 points of the substrate must be irradiated with a laser light. Likewise, the number of points to be irradiated with a laser light increases with an increasing size of the substrate, for example, as in a 1 m×1 m substrate. Such a laser-induced crystallization is generally performed by a pulse laser irradiator having a configuration shown in FIG. 15.

To form uniform thin film semiconductor elements on a large substrate by the above technique, an effective process is known as disclosed in Japanese Unexamined Patent Publication (JP-A) No. 5-211167 (Japanese Patent Application No. 3-315863). The process includes the steps of dividing the elements to portions smaller than the beam size of the laser and repeating a combination of irradiation with several pulses and movement of the area to be irradiated by step-and-repeat drawing method. In the process, the lasing and the movement of a stage (i.e., the movement of a substrate or laser beam) are alternatively performed, as shown in FIG. 16(2). However, even according to this process, the variation of lasing intensity exceeds ±5% to ±10% when the irradiation procedure is repeated at a density of about 1 pulse per irradiated portion to 20 pulses per irradiated portion using a currently available pulse laser irradiator with a uniformity of lasing intensity of ±5% to ±10% (in continuous lasing). The resulting polycrystalline silicon thin film and polycrystalline silicon thin film transistor cannot therefore have satisfactorily uniform characteristics. Particularly, the generation of a strong or weak light caused by an unstable discharge at early stages of lasing significantly invites such heterogeneous characteristics. This phenomena is called as spiking. As a possible solution to the spiking, a process of controlling an applied voltage in a subsequent lasing with reference to the results of integrated strengths can be employed. However, according to this process, a weak light is rather oscillated even though the formation of spiking is inhibited. Specifically, when irradiation periods and non-lasing periods are alternated, the intensity of a first irradiated pulse in each irradiation period is most unstable and is varied, as shown in FIG. 17. In addition, the history of irradiation intensity differs from point to point to be irradiated. The resulting transistor element and thin film integrated circuit cannot have a significant uniformity in the substrate plane.

To avoid such a spiking, a process is known to start lasing prior to the initiation of irradiation to an area for the formation of element, as shown in FIG. 16(2). However, this technique shown in FIG. 16(2) cannot be applied to a process of intermittently repeating the lasing and the movement of stage. To avoid these problems, a process is proposed in Japanese Unexamined Patent Publication (JP-A) No. 5-90191. The process includes the steps of allowing a pulse laser source to continuously oscillate and inhibiting irradiation of a substrate with the laser light by an optic shielding system during the movement of the stage. Specifically, as shown in FIG. 16(3), a laser is continuously oscillated at a predetermined frequency, and the movement of stage to a target irradiation position is brought into synchronism with the shielding of an optic path. By this configuration, a laser beam with a stable intensity can be applied to a target irradiation position. However, although this process can stably irradiate the substrate with a laser beam, the process also yields increased excess lasing that does not serve to the formation of a polycrystalline silicon thin film. The productivity is decreased from the viewpoint of the life of an expensive laser source and an excited gas, and the production efficiency of the polycrystalline silicon thin film is deteriorated with respect to power required for lasing. The production costs are therefore increased. When a substrate to be exposed to laser is irradiated with an excessively strong light as compared with a target intensity, the substrate will be damaged. Such an excessively strong light is induced by an irregular irradiation intensity. In LCDs and other imaging devices, a light passing through the substrate scatters in an area where the substrate is damaged, and the quality of image is deteriorated.

A process is known for the laser irradiation. In this process, a plurality of pulses are applied while the irradiation of each pulse is retarded. This process is disclosed by Ryoichi Ishihara et al. in "Effects of light pulse duration on excimer laser crystallization characteristics of silicon thin films", Japanese Journal of Applied Physics, vol. 34, No. 4A, (1995), pp 1759 (hereinafter called as Reference). According to this Reference, the crystallization solidification rate of a molten silicon in a laser recrystallization process is 1 m/sec or more. To achieve a satisfactory growth of crystals, the solidification rate must be reduced. By applying a second laser pulse immediately after the completion of solidification, the second irradiation of laser pulse can yield a recrystallization process with a lower solidification rate. In viewing a temperature change (a time-hysteresis curve) of silicon as shown in FIG. 18, the temperature of silicon increases with the irradiation of laser energy, for example, as a pulse with an intensity shown in FIG. 19. When a starting material is an amorphous silicon (a-Si), the temperature further increases after the melting point of a-Si, and when the supplied energy becomes less than the energy required for increasing the temperature, the material begins to undergo cooling. At the solidifying point of a crystalline Si, the solidification proceeds for a solidification time and then completes, and the material is cooled to an atmospheric temperature. Provided that the solidification of silicon proceeds in a thickness direction from an interface between silicon and the substrate, an average solidification rate is calculated according to the following equation.

Average solidification rate=(Thickness of silicon)/(Solidification time)

Specifically, if the thickness of silicon is constant, the solidification time is effectively prolonged to reduce the solidification rate. If the process maintains ideal conditions on thermal equilibrium, the solidification time can be prolonged by increasing an ideally supplied energy, i.e., a laser irradiation energy. However, as pointed out in the above reference, such an increased irradiation energy invites the resulting film to become amorphous or microcrystalline. In an actual melting and recrystallization process, the temperature does not change in an ideal manner as shown in FIG. 18, and the material undergoes overheating when heated and undergoes supercooling when cooled, and attains a stable condition. Particularly, when the cooling rate in cooling procedure is extremely large and the material undergoes an excessive supercooling, the material is not crystallized at around its solidification point, and becomes an amorphous solid due to quenching and rapid solidification. Under some conditions, thin films are converted not into amorphous materials but into microcrystals, as shown in the above-mentioned Reference.

Accordingly, an object of the invention is to provide a process for forming a semiconductor thin film with a lower trap state density by light irradiation and to provide a process and system for applying the above process to large substrates with a high reproducibility.

Another object of the invention is to provide a means for forming a satisfactory gate insulating film on the semiconductor thin film of good quality and to provide a system for producing a field effect transistor having a satisfactory semiconductor-insulating film interface, i.e., satisfactory properties.

SUMMARY OF THE INVENTION (1) According to the present invention, there is provided a thin film processing method for processing the thin film by irradiating the optical beam to the thin film, wherein one set of irradiation of the optical beam includes a first and a second optical pulse irradiated to the thin film, and each of the first and the second optical pulse has different pulse waveforms.

(2) According to the present invention, there is provided a thin film processing method wherein the one set of irradiation includes the first optical pulse irradiation to the thin film and the second optical pulse irradiation to the thin film which substantially starts simultaneously with the irradiation of the first pulse.

(3) According to the present invention, there is provided a thin film processing method as described in (2), wherein the relationship between the first and the second pulse satisfies (the pulse width of the first optical pulse)<(the pulse width of the second optical pulse), (the irradiation intensity of the first optical pulse)≧(the irradiation intensity of the second optical pulse).

(4) According to the present invention, there is provided a thin film processing method as described in (1), wherein the one set of irradiation includes the first optical pulse irradiation to the thin film and the second optical pulse irradiation to the thin film which substantially starts with a delay to the first optical pulse irradiation.

(5) According to the present invention, there is provided a thin film processing method as described in (4), wherein the relationship between the first and the second pulse satisfies (the pulse width of the first optical pulse)<(the pulse width of the second optical pulse).

(6) According to the present invention, there is provided a thin film processing method as described in (5), wherein the relationship between the first and the second pulse satisfies (the irradiation intensity of the first optical pulse)≧(the irradiation intensity of the second optical pulse).

(7) According to the present invention, there is provided an apparatus for processing thin film by irradiating the optical pulse to the thin film, the thin film processing apparatus comprises a first and a second pulse optical source for producing a first and a second optical pulse, respectively, wherein the first and the second optical pulse has different pulse waveforms, and the one set of irradiation of the optical beam includes the irradiation for the first and the second optical pulse to the thin film, wherein the set of irradiation is carried out repeatedly.

(8) According to the present invention, there is provided a thin film processing apparatus as described in (7), wherein the one set of irradiation includes the first optical pulse irradiation to the thin film and the second optical pulse irradiation to the thin film which substantially starts simultaneously with the irradiation of the first pulse.

(9) According to the present invention, there is provided a thin film processing apparatus as described in (8), wherein the relationship between the first and the second pulse satisfies (the pulse width of the first optical pulse)<(the pulse width of the second optical pulse), (the irradiation intensity of the first optical pulse)≧(the irradiation intensity of the second optical pulse).

(10) According to the present invention, there is provided a thin film processing apparatus as described in (7), wherein the one set of irradiation includes the first optical pulse irradiation to the thin film and the second optical pulse irradiation to the thin film which substantially starts with a delay to the first optical pulse irradiation.

(11) According to the present invention, there is provided a thin film processing method as described in (10), wherein the relationship between the first and the second pulse satisfies (the pulse width of the first optical pulse)<(the pulse width of the second optical pulse).

(12) According to the present invention, there is provided a thin film processing apparatus as described in (11), wherein the relationship between the first and the second pulse satisfies (the irradiation intensity of the first optical pulse)≧(the irradiation intensity of the second optical pulse).

FIG. 11 shows the relationship of the maximum cooling rate (Cooling rate, K/sec) obtained by mathematical calculation with the threshold irradiation intensity between crystallization and microcrystallization. In this case, a 75-nm silicon thin film is irradiated with an excimer laser with a wavelength of 308 nm, and the threshold is obtained by a scanning electron microscopic (SEM) observation of the silicon thin film after laser irradiation. FIG. 19 shows an emission pulse shape of the laser used in the experiment. This pulse shape exhibits a long emission time 5 times or more that of a rectangular pulse with a pulse width of 21.4 nsec described in the relevant Reference. Even a single pulse irradiation with the pulse shape in question is therefore expected to reduce the solidification rate as described in the Reference. FIG. 12 shows a calculated temperature-time curve of silicon in laser recrystallization using the pulse shape in question. Specifically, FIG. 12 shows the temperature change of a silicon thin film 75 nm thick on a $SiO_2$ substrate when an XeCl laser (having a wavelength of 308 nm) is applied at an irradiation intensity of 450 mJ/cm². About 60 nsec into the irradiation, a second emission peak nearly completes, and the temperature attains the maximum and then turns to decrease. (In this connection, in the mathematical calculation, a melting-solidification point of amorphous silicon is employed as the melting-solidification point, and the behavior of the material round the solidification point differs from that in actual case. Particularly when a crystallized film is obtained, the crystallization completes at the solidification point of the crystalline silicon.) The curve has a large gradient upon the initiation of cooling, but has a very small gradient at about 100 nsec, i.e., at a third emission peak. At elapsed time of 120 nsec, the light emission completely ceases, and the silicon is then solidified through another rapid cooling process. Generally, when a liquid is solidified through "quenching" which is greatly out of a thermal equilibrium process, a sufficiently long solidification time cannot be obtained to form a crystal structure, and the resulting solid is amorphous (non-crystal). The maximum cooling rate was estimated from a temperature-time curve of silicon as shown in FIG. 12. FIG. 11 shows the estimated maximum cooling rates after the completion of light emission with respect to individual irradiation intensities. The figure shows that the cooling rate increases with an increasing irradiation intensity. Separately, the structure of the silicon thin film after laser irradiation was observed with a scanning electron microscope. As a result, as shown in FIG. 13, the grain size once increased with an increasing irradiation intensity, but microcrystallization was observed at a set irradiation intensity of about 470 mJ/cm². When the film was irradiated with three laser pulses, the grain size markedly increased even at a set irradiation intensity of about 470 mJ/cm², while a microcrystallized region partially remained (FIG. 13). This large increase of the grain size differs from the behavior of the grain size in the one-pulse irradiation. In this connection, an actual irradiation intensity is 5% to 10% higher than the set level, typically in initial several pulses of excimer laser. The threshold intensity at which microcrystallization occurs can be therefore estimated as about 500 mJ/cm². Based on these results, the cooling rate at 500 mJ/cm² as shown in FIG. 11 is estimated, and microcrystallization is found to occur at a cooling rate of about $1.6 \times 10^{10}$° C./sec or more. When the film to be irradiated is an a-Si film, the microcrystallization occurs at an irradiation intensity of about 500 mJ/cm² or more. Likewise, when the film to be irradiated is a poly-Si film, the microcrystallization may occur at an irradiation intensity about 30 mJ/cm² higher than that in the a-Si at the same cooling rate of about $1.6 \times 10^{10}$° C./sec. By controlling the cooling rate to $1.6 \times 10^{10}$° C./sec or less, therefore, the resulting crystal can be kept from becoming microcrystalline or amorphous and can satisfactorily grow.

Next, the case where a delayed second laser light is irradiated with a delay relative to a first laser light. As is described above, a laser light at a late light emission stage suppresses the increase of the cooling rate, and the cooling rate after the completion of light emission controls the crystallization. The last supplied energy is supposed to initialize precedent cooling processes. Specifically, by supplying an additional energy, a precedent cooling process is once initialized and a solidification process is repeated again, even if the crystal becomes amorphous or microcrystalline in the precedent cooling process. This is provably because the interval of light irradiation is very short of the order of nanoseconds, and loss of the energy by thermal conduction to the substrate and radiation to the atmosphere is small. The energy previously supplied therefore remains nearly as intact. In this assumption, a long time interval sufficient to dissipate heat is not considered. Accordingly, by controlling the cooling rate after the completion of a second heating by the additionally supplied energy, the crystal is expected to grow satisfactorily. As shown in FIG. 14, the cooling rate is controlled to a desired level by controlling the delay time of the second laser irradiation.

DESCRIPTION OF THE PREFERRED EMBODIMENT

The embodiments of the invention will now be illustrated in detail with reference to the drawings.

Figure 1:
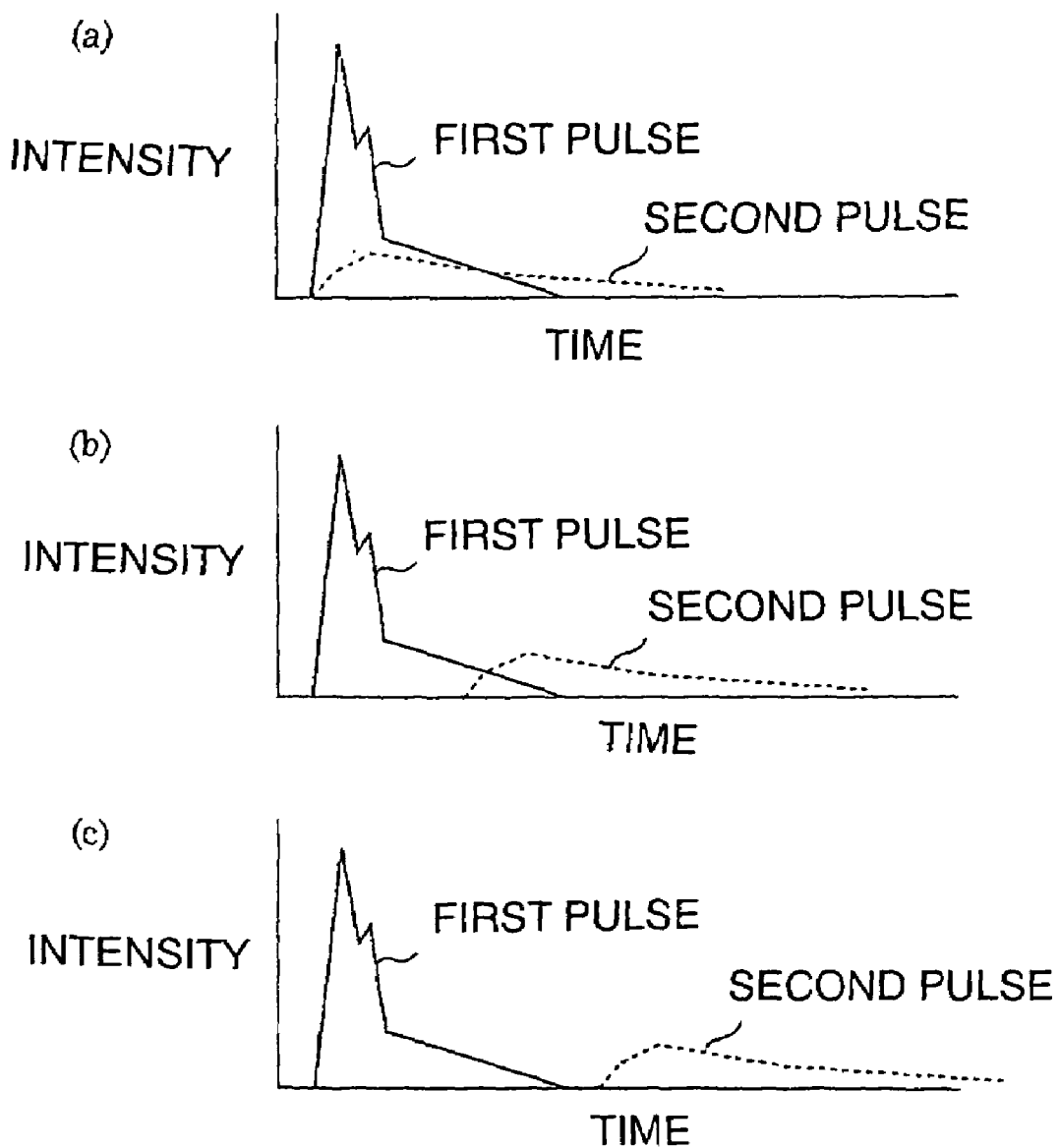
FIG. 1 shows an optical pulse waveform for use in describing the embodiment according to the present invention.

FIG. 1 illustrates an example of the embodiment of the present invention. Each of the oscillation start timings is depicted on the abscissa axis while the irradiation energy is depicted as the region bound by the pulse line. FIG. 1($a$) shows an example where a first pulse laser and a second pulse laser are oscillated at the simultaneous timing. The time interval required between the supply of the trigger signal for controlling the oscillation and the actual start of the oscillation often depends upon the construction of the laser apparatus. Therefore, the "trigger oscillation" time is predetermined so that the irradiation can be simultaneously carried out. Since the emission time of the second pulse is longer than that of the first pulse, the gradual-cooling effect becomes higher during the melting and solidifying process. Moreover, during the melting process by the first pulse, with the advantageous of the initial region processed by the second pulse, the larger area can be melted at once such that the processing speed will become much faster.

Figure 11:
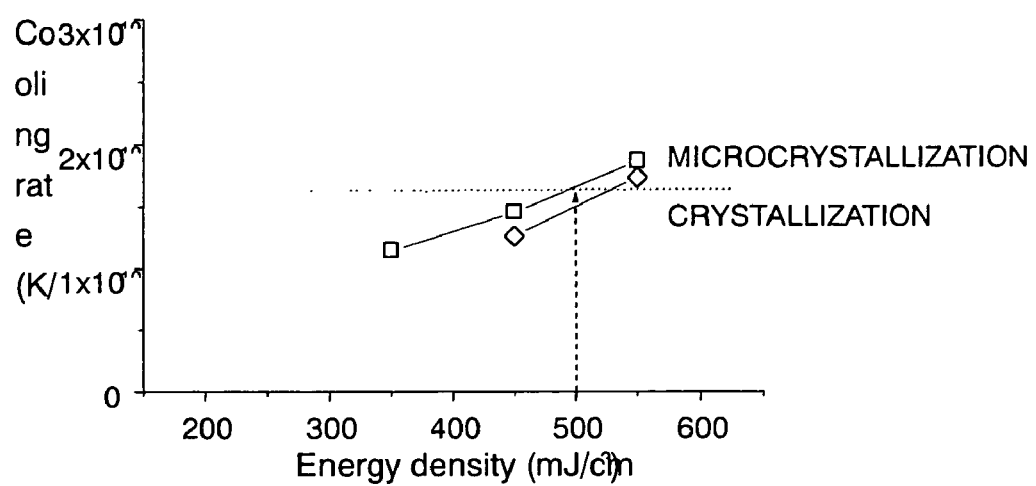
FIG. 11 is a diagram showing the relationship between the irradiation intensity and the cooling rate, and the cooling rate at which the film becomes amorphous.
Figure 12:
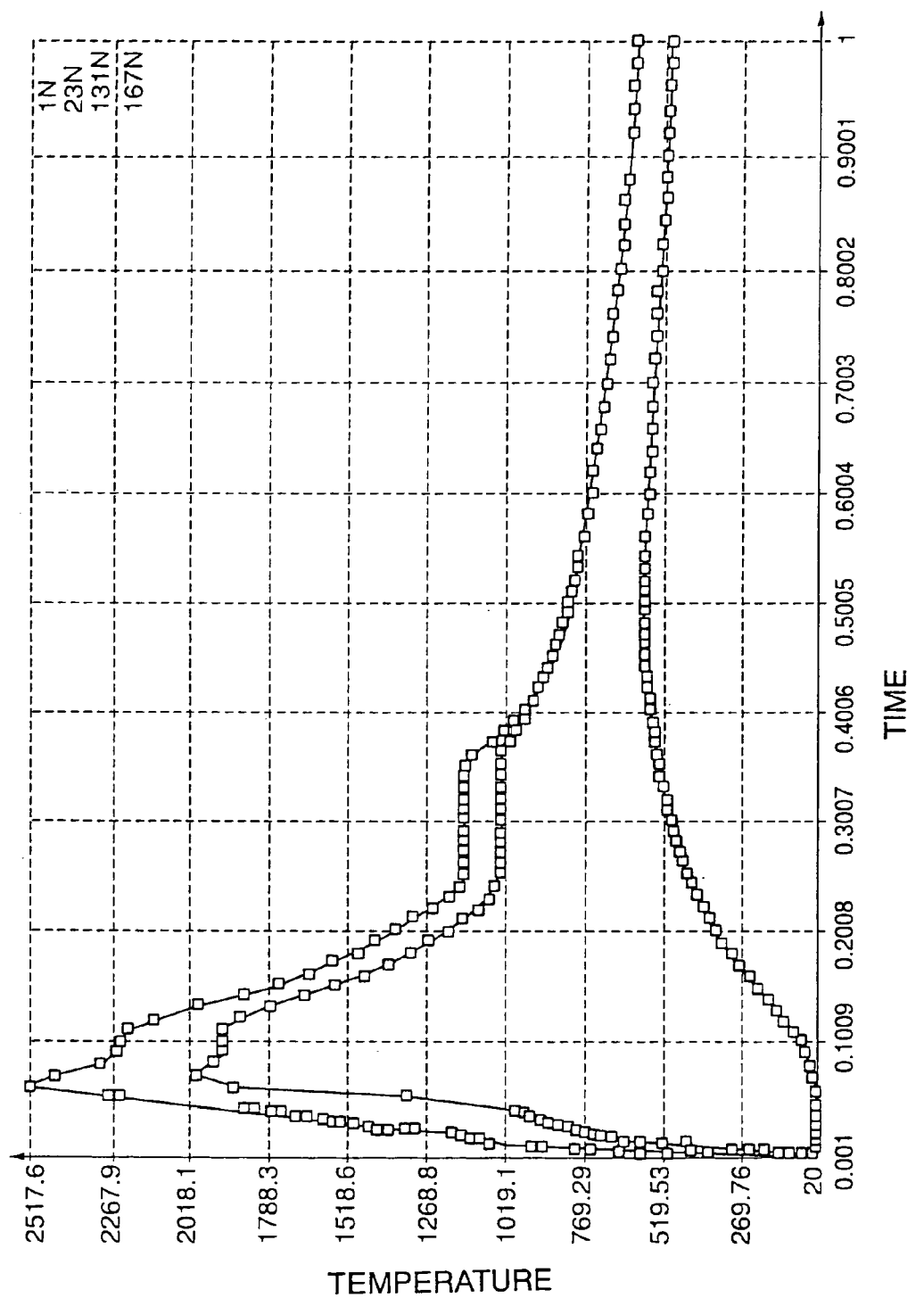
FIG. 12 is an illustrative diagram of calculated temperature changes of a silicon thin film.
Figure 13:
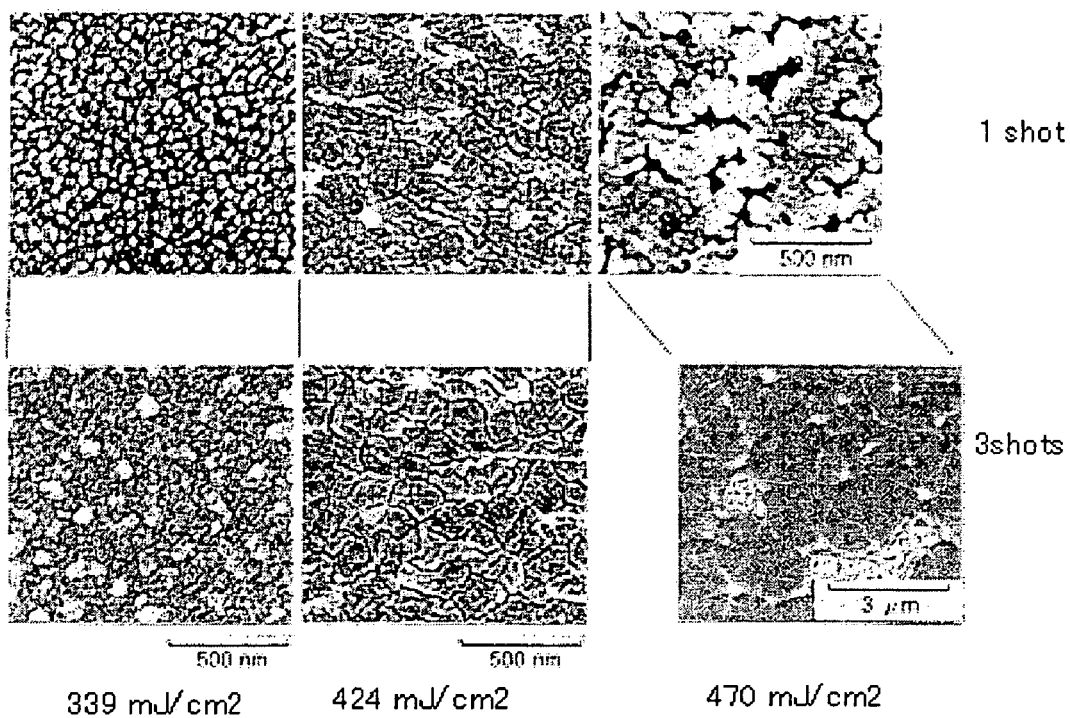
FIG. 13 is a diagram showing crystal forms of silicon thin films corresponding to individual irradiation intensities.
Figure 14:
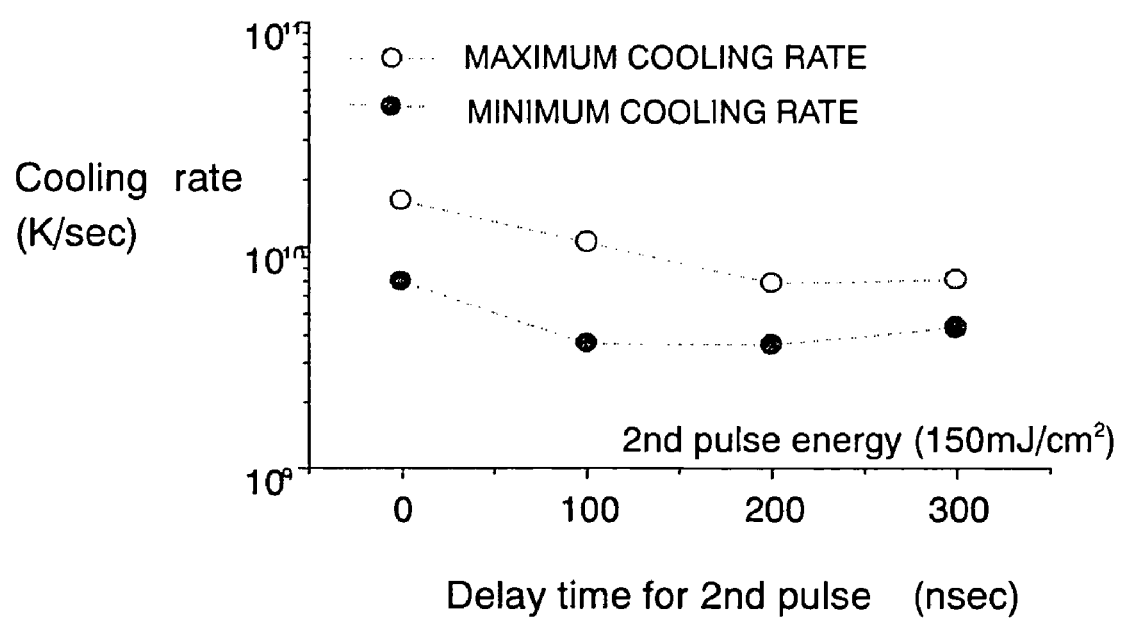
FIG. 14 is a diagram showing the maximum cooling rate after the supply of a second pulse, and the cooling rate around the solidification point.
Figure 15:
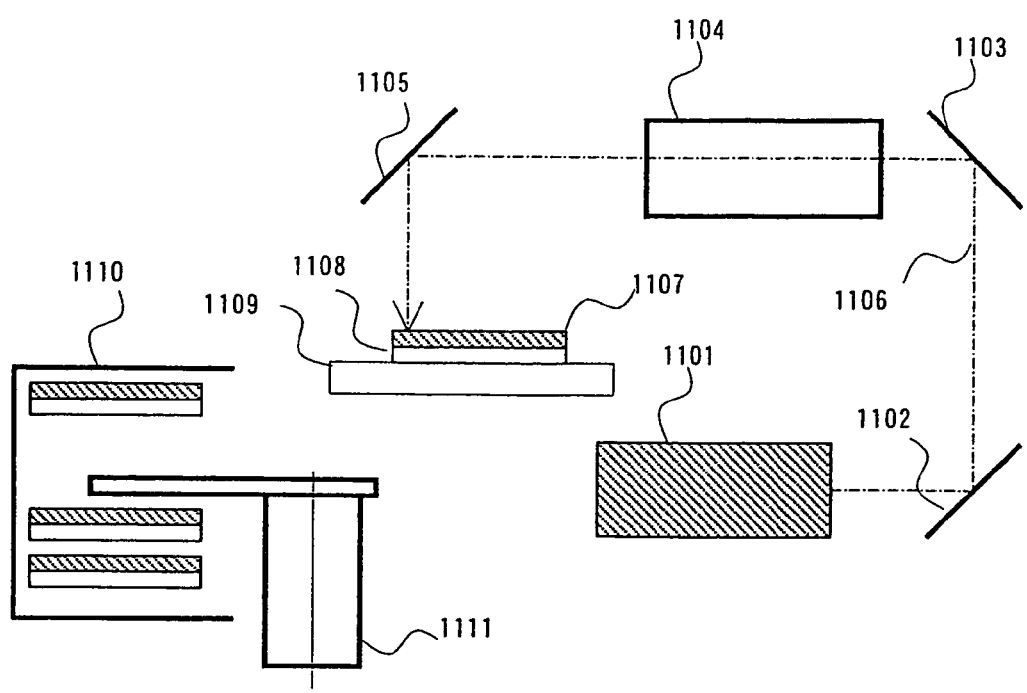
FIG. 15 is a schematic view of a conventional excimer laser annealing apparatus.
Figure 16:
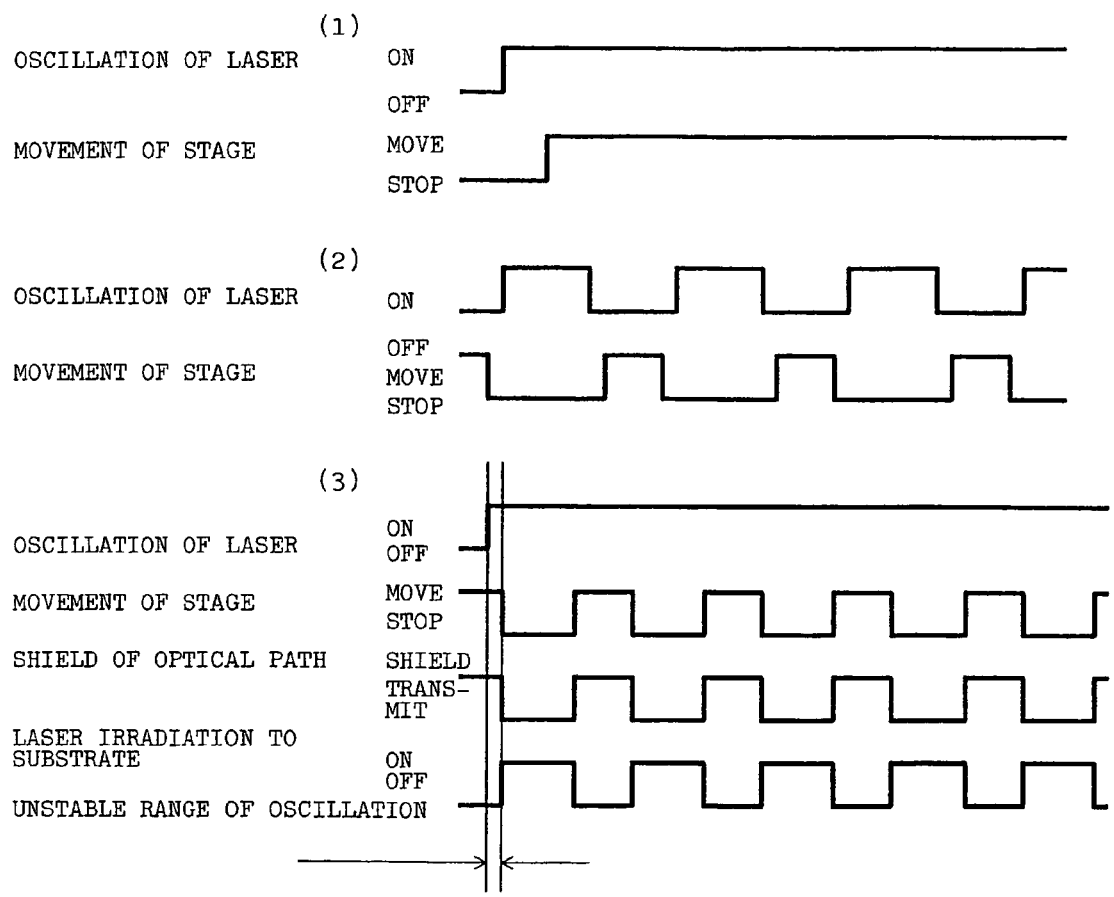
FIG. 16 is a timing chart showing conventional and invented operation procedures of laser annealing.

FIG. 1($b$) shows an example of the state in which the second pulse is supplied with a delay to the oscillation of the first pulse. The state is much more preferable when the first pulse utilizes the optical source with a small pulse width. In case where the melting and recrystallizing process is performed only by the first pulse, the gradual-cooling is carried out because the amount of heat provided together with the increase of the irradiation intensity increases. However, as shown in FIG. 11, when the maximam cooling rate increases within an extremely short time interval during the laser irradiation process and exceeds the critical cooling rate, the solidifying process deviates the ideal thermal equilibrium state. As a result, the microcrystalline or amorphous crystal are to be observed in the film thus obtained. The above-mentioned maximum cooling rate is observed immediately after the peak of the irradiation pulse has been irradiated. At this stage, it is possible to recover the melting state by supplying the additive energy before the completion of the cooling process. By irradiating, as the means to supply the additive energy, the pulse that has a long pulse width and a small peak intensity, it is possible to prevent the deviation to the non-equilibrium state and to realize the gradual-cooling process. It is required to predetermine by the experiment the delay time of the second pulse because it varies depending on the intensity and the waveform of the first pulse. In the present embodiment, the preferable delay time is about 50–200 nsec. Since the pulse width used as the first pulse was about 120 nsec, under the condition where the delay time exceeds 120 nsec, the second pulse is controlled to be irradiated after the completion of the emission of the first pulse as shown in FIG. 1($c$).

Figure 2:
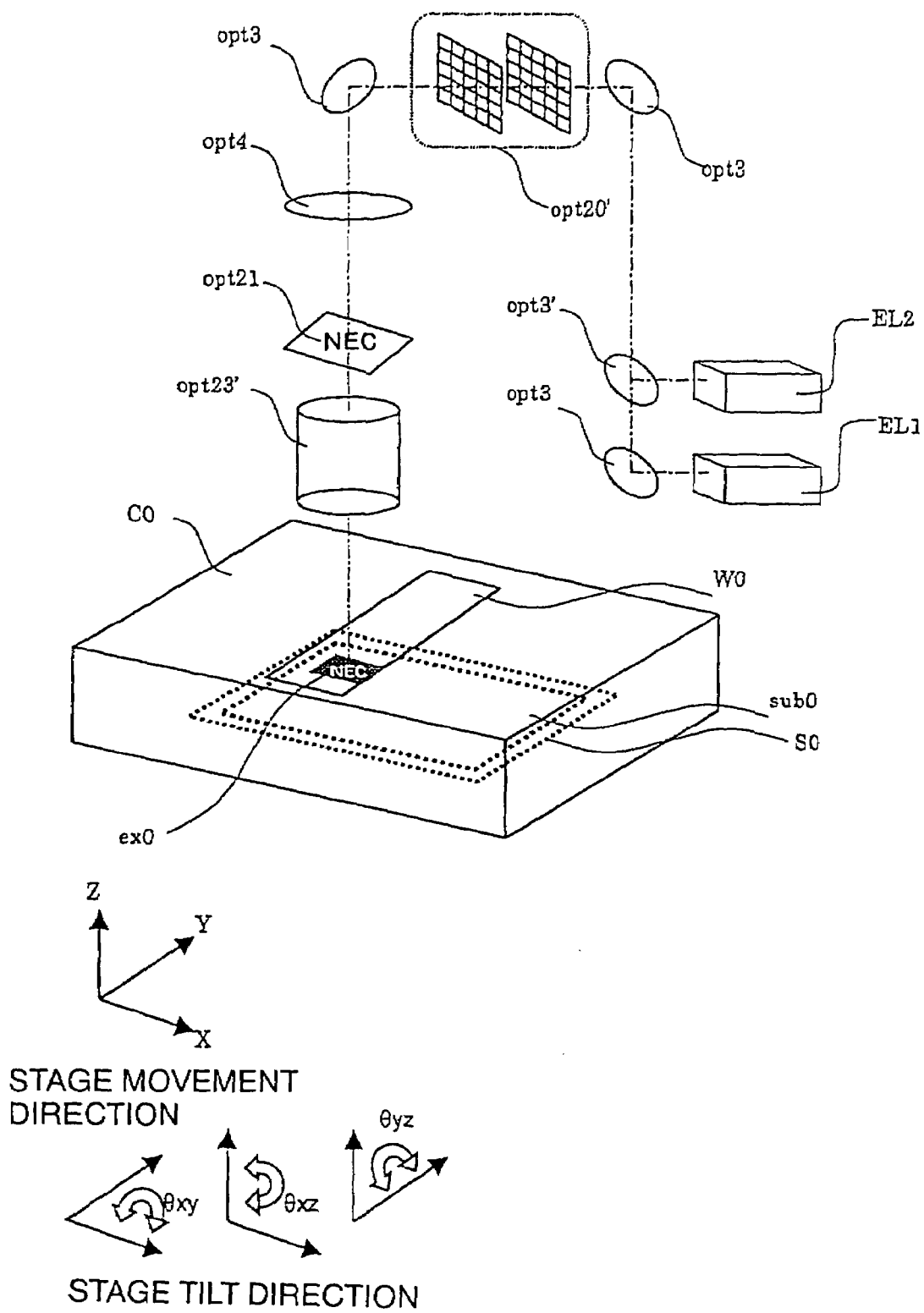
FIG. 2 is a diagram showing an embodiment (the overall configuration) of the invented exposure system.

FIG. 2 shows an embodiment of the invention. Pulsed ultraviolet (UV) beams are supplied from a first excimer laser EL1 and a second excimer laser EL2 and are introduced via mirrors opt3 and otp3' and lenses opt4 to a homogenizer opt20'. The intensity profile of the beam is adjusted in the homogenizer so as to attain a target uniformity in a photo mask opt21, for example, an in-plane distribution of ±5%. (Original beams supplied from the excimer lasers may have an intensity profile or total energy which varies pulse to pulse. The system therefore preferably includes a mechanism for adjusting the spatial intensity distribution and pulse-to-pulse intensity variation on the photo mask to achieve a higher uniformity. The homogenizer generally includes a fly-eye lens or a cylindrical lens.) The patterned light formed by the photo mask is applied via a reduction projection optical system opt23' and a laser inlet window W0 onto a substrate sub0 placed in a vacuum chamber C0. The substrate is mounted on a substrate stage S0, and a target region, for example, a pattern transfer region ex0, can be exposed to the patterned light by operating the substrate stage. In FIG. 2, the reduction projecting optical system is illustrated, but the system can include a 1:1 projecting optical system or an enlargement projecting optical system. An optional region on the substrate is irradiated with the patterned light by moving the substrate stage in X-Y direction in the figure. The photo mask is mounted on a mask stage (not shown), and the beam to be applied on the substrate can be controlled also by moving the photo mask within a region capable of exposing.

To apply a target patterned light onto the substrate under desired conditions, a mechanism is required. An illustrative mechanism will now be described. As an optical axis should be delicately and precisely adjusted, in the following example, the optical axis is once adjusted and then fixed, and the position of the substrate is adjusted to control the irradiation. For adjusting the position of the irradiated surface of the substrate relative to the optical axis, the position of the surface in a direction of the focus (Z direction) and the verticality relative to the optical axis must be corrected. Of the θxy tilt correction direction, θxz tilt correction direction, θyz tilt correction direction, X exposure region moving direction, Y exposure region moving direction, and Z focusing direction in the figure, the verticality relative to the optical axis is corrected by adjusting in the θxy tilt correction direction, θxz tilt correction direction, and θyz tilt correction direction. The position of the irradiated surface of the substrate is controlled to an appropriate position according to the focal depth of the optical system by adjusting the Z focusing direction.

Figure 3:
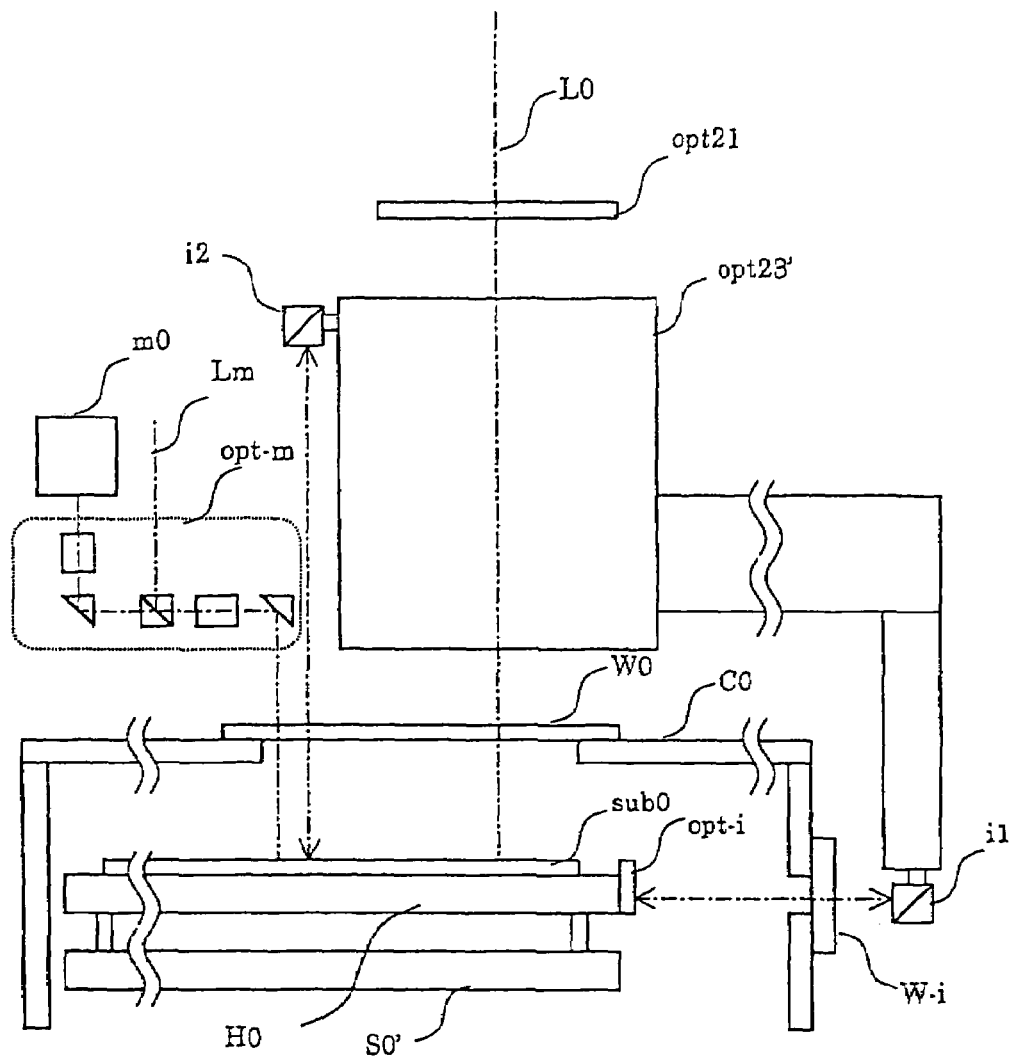
FIG. 3 is a diagram showing an embodiment (aligning process) of the invented exposure system.

FIG. 3 is an illustrative side sectional view of the adjustment and alignment mechanism of the substrate. The photo mask opt21, the reduction projection optical system opt23', and the laser inlet window W0 are arranged with respect to an exposure axis L0, as shown in the figure. The substrate sub0 placed in a vacuum chamber C0 is mounted on a heater H0 with a substrate adhesion mechanism, and a substrate—XYZθxyθxzθyz—stage S0'. In this embodiment, a vacuum chamber is used, but an actual light irradiation should be preferably performed in an atmosphere of, for example, an inert gas, hydrogen gas, oxygen gas, or nitrogen gas. The inside of the chamber is once evacuated and is then replaced with the above-mentioned gas. The pressure in the chamber may be around atmospheric (barometric) pressure. By using a heater with a substrate adhesion mechanism, the substrate can be heated at a temperature of from room temperature to about 400° C. in light irradiation procedure. When the inside pressure is set around barometric pressure, the substrate can be adhered to the heater through a vacuum chucking mechanism. Accordingly, the misalignment of the substrate can be inhibited even if the substrate stage moves in the chamber, and the supplied substrate can be surely fixed to the substrate stage even if the substrate has some warp or bending. In addition, the shift of the focal depth due to heat-induced warp or bending can be minimized.

Laser interferometers i1 and i2 make alignment of the substrate and a measurement of the position of the substrate in Z direction, via a length measuring window W-i and a length measuring mirror opt-i. To align the substrate, the position of an alignment mark on the substrate is determined with an off-axis microscope m0, a microscope light source Lm, and a microscope element opt-m. A target exposure position can be determined using information about the substrate position obtained from the laser interferometer system. In FIG. 3, the off-axis alignment is illustrated, but the invented system can also employ through-the-lens alignment or through-the-mask (through-the-reticule) alignment. In the measurement, measurement errors can be averaged by making measurements from plural measuring points and determining a linear coordinate based on the measured data through the least square method.

Figure 4:
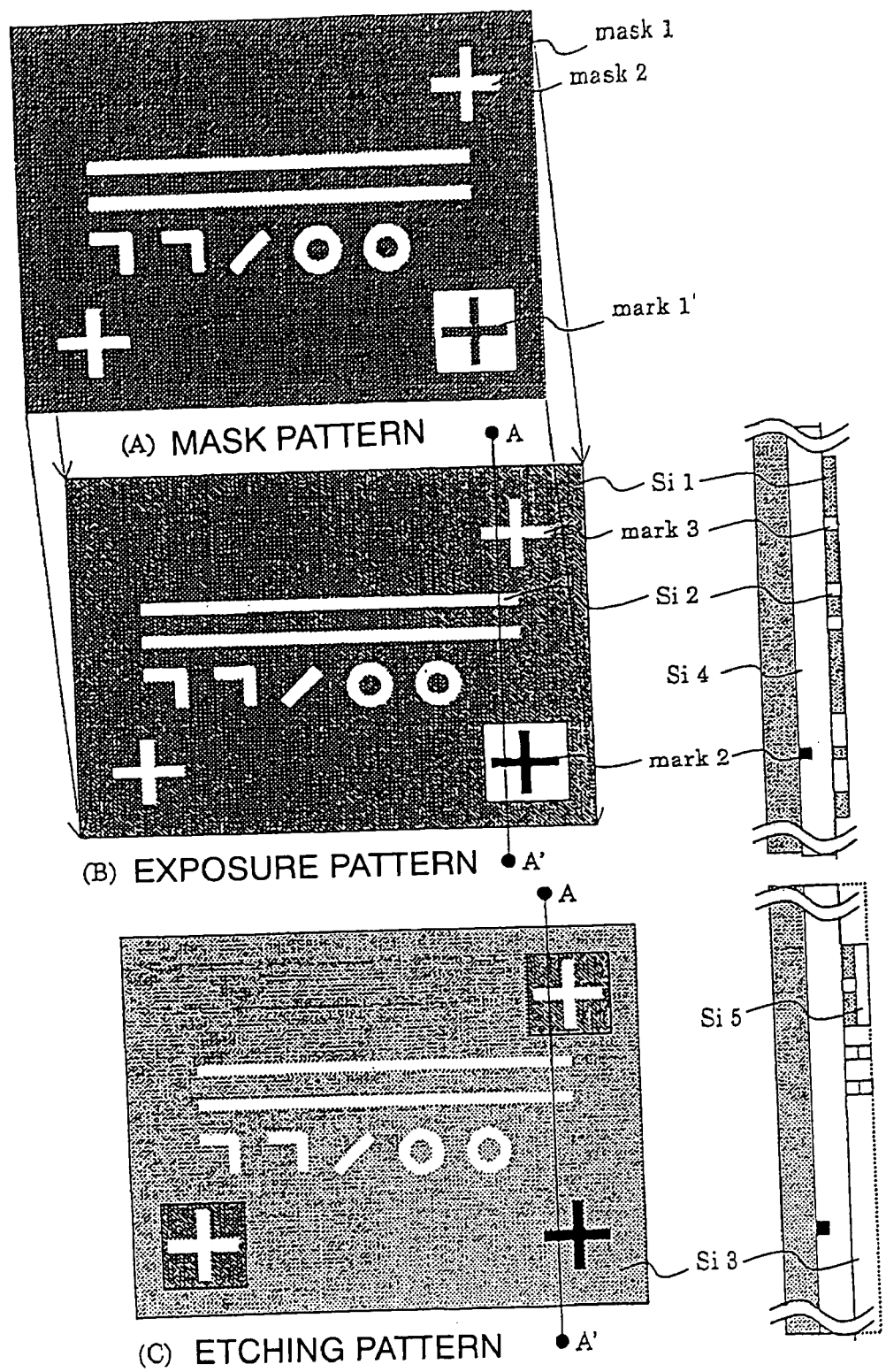
FIG. 4 are diagrams showing an embodiment (mask projection process) of the invented exposure system.

FIGS. 4(A) to 4(C) show the relationship between a mask pattern and an alignment mark. The mask includes a mask (non-exposure area) mask1 and a mask (exposure area) mask2. For example, when an excimer laser is used as the light source, a film that absorbs and reflects ultraviolet radiation is formed on a quartz substrate. The ultraviolet radiation passes through such a quartz substrate. The film is formed from, for example, aluminum, chromium, tungsten, or other metals, or is a dielectric multilayer film, and is then patterned by photolithography and etching processes to yield the mask. According to a target pattern on the mask (indicated by the white areas in FIG. 4(A), a silicon film is exposed to yield exposed Si portions (Si2) in a non-exposed Si (Si1) as shown in FIGS. 4(B) and 4(C). Where necessary, alignment and adjustment is conducted to make a mark on the mask mark1 agree with a mark on the substrate mark2 prior to exposure. A predetermined and designed region on the silicon thin film can be therefore exposed. In the thin film transistor forming process using a silicon thin film, if the exposure process is a first process requiring the alignment (i.e., no alignment mark is formed prior to the exposure process), an exposed mark mark3 should be preferably formed by exposure concurrently in the exposure process of the silicon thin film. By this procedure, an alignment mark can be formed using an optical color difference between a-Si and crystalline Si. By performing, for example, photolithography in a successive process with reference to the above alignment mark, transistors and other desired mechanisms and functions can be formed in target regions which are exposed and modified. Subsequent to the exposure process, an Si oxide film is formed on the silicon thin film and a target region of the silicon film is removed by etching. FIG. 4(C) show the state just mentioned above. A removed Si region (Si3) is a region where the laminated silicon film and Si oxide film are removed by etching. In this configuration, Si oxide films (Si4 and Si5) are laminated on the non-exposed Si (Si1) and the exposed Si (Si2). By forming island structures including a silicon film covered with an oxide film as stated above, desired channel-source-drain regions of a thin film transistor or alignment marks necessary for successive processes can be formed. In such a transistor, elements are separated from one another.

Figure 5:
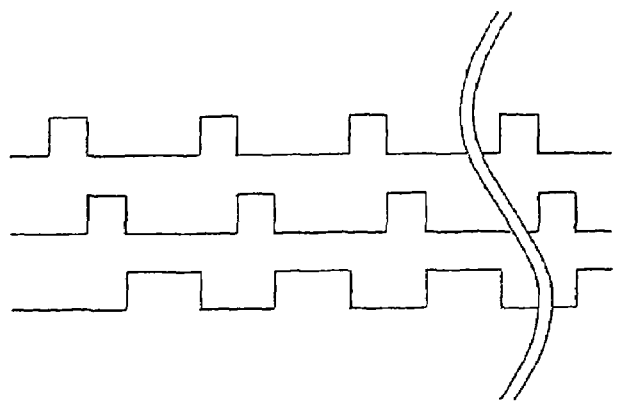
FIG. 5 are diagrams showing embodiments (control procedures) of the invented exposure system.
Figure 5:
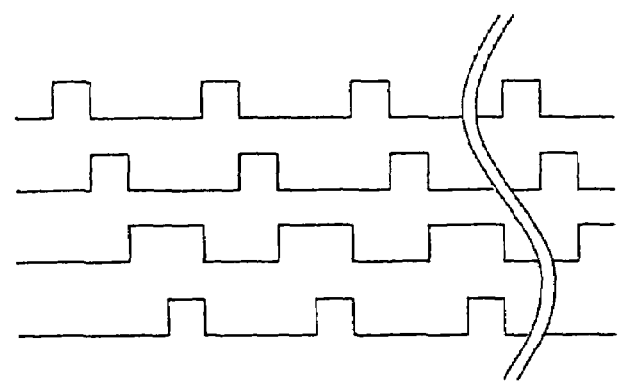

FIGS. 5(1) and (2) are timing charts of essential control procedures. In the illustrative control procedure (1), the substrate is moved to a target exposure position by operating the substrate stage. Next, the exposure position is accurately adjusted by focusing or alignment operation. In this procedure, the exposure position is adjusted to achieve a target predetermined accuracy of error of, for example, about 0.1 μm to 100 μm. On completion of this operation, the substrate is irradiated with light. On completion of series of these operations, the substrate is moved to a successive exposure position. On completion of irradiation of all the necessary regions on the substrate, the substrate is replaced with a new one, and the second substrate to be treated is subjected to a series of the predetermined operations. In the control procedure (2), the substrate is moved to a target exposure position by operating the substrate stage. Next, the exposure position is accurately adjusted by focusing or alignment operation. In this procedure, the exposure position is adjusted to achieve a target predetermined accuracy of error of, for example, about 0.1 µm to 100 µm. On completion of this operation, the mask stage starts to operate. In the illustration, the substrate is irradiated with light after the initiation of the mask stage operation to avoid variation of moving steps during startup. Naturally, a region at a distance from the alignment position is to be exposed due to the movement of the stage, and an offset corresponding to the shift must be previously considered. To avoid unstable operations, the light source may be operated prior to the light irradiation to the substrate, and the substrate may be irradiated with light by opening, for example, a shutter. Particularly, when an excimer laser is employed as the light source and lasing periods and suspension periods are repeated in turn, several ten pulses emitted at early stages are known to be particularly unstable. To avoid irradiation with these unstable laser pulses, the beams can be intercepted according to the operation of the mask stage. On completion of irradiation of all the necessary regions on the substrate, the substrate is replaced with a new one, and the second substrate to be treated is subjected to a series of the predetermined operations.

In this connection, an a-Si thin film 75 nm thick was scanned with a 1 mm×50 µm beam at a 0.5-µm pitch in a minor axis direction. When the scanning (irradiation) was performed using one light source at a laser irradiation intensity of the irradiated surface of 470 mJ/cm$^2$, a continuous single-crystal silicon thin film in the scanning direction was obtained. In addition, a beam from a second light source was applied with a delay time of 100 nsec to yield a laser irradiation intensity of the irradiated surface of 150 mJ/cm$^2$, a continuous single-crystal silicon thin film in the scanning direction was obtained, even at a scanning pitch of 1.0 µm. The trap state density in the crystallized silicon film was less than $10^{12}$ cm$^{-2}$.

Figure 6:
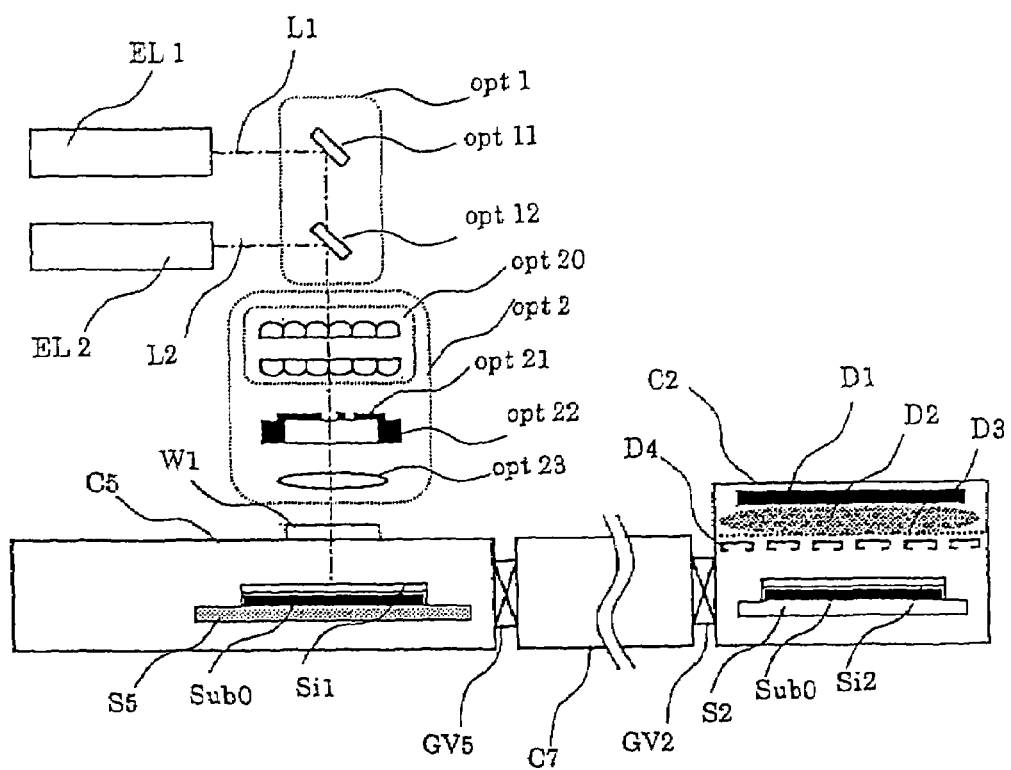
FIG. 6 is a side sectional view showing the invented exposure system, transfer chamber, and plasma-enhanced CVD chamber.

FIG. 6 is a side sectional view of an embodiment of the invented semiconductor thin film forming system. The system includes a plasma-enhanced CVD chamber C2, a laser irradiation chamber C5, and a substrate transfer chamber C7. In the system, the substrate can be transferred via gate valves GV2 and GV5 without exposing to an atmosphere outside the system. The transfer can be performed in vacuo or in an atmosphere of an inert gas, nitrogen gas, hydrogen gas or oxygen gas, in high vacuum, under reduced pressure or under pressure. In the laser irradiation chamber, the substrate is placed on a substrate stage S5 with the aid of a chucking mechanism. The substrate stage S5 can be heated to about 400° C. In the plasma-enhanced CVD chamber, the substrate is placed on a substrate holder S2. The substrate holder S2 can be heated to about 400° C. The figure illustrates the following state. A silicon thin film Si1 is formed on a glass substrate Sub0, and the substrate is then brought into the laser irradiation chamber. The surface silicon thin film is modified into a crystalline silicon thin film Si2 by laser irradiation, and the substrate is then transferred to the plasma-enhanced CVD chamber.

Laser beams are brought into the laser irradiation chamber in the following manner. The laser beams are supplied from an excimer laser 1 (EL1) and an excimer laser 2 (EL2), pass through a first beam line L1 and a second beam line L2 and a laser composing optical system opt1, a mirror opt11, a transmissive mirror opt12, a laser irradiation optical system opt2, a homogenizer opt20, a photo mask opt21 mounted and fixed on a photo mask stage opt22, a projection optical system opt23, and a laser inlet window W1, and reach the substrate surface. In this figure, two excimer lasers are illustrated, but an optional number (one or more) of light sources can be employed in the system. The light source is not limited to the excimer laser and includes, for example, carbon gas laser, yttrium-aluminum-garnet (YAG) laser, and other pulse lasers. In addition, laser pulses can be made and applied onto the substrate by using argon laser or another continuous wave (CW) light source and a high speed shutter.

In the plasma-enhanced CVD chamber, a radio frequency (RF) electrode D1 and a plasma confinement electrode D3 constitute a plasma generating region D2 at a position at a distance from a region where the substrate is placed. For example, oxygen and helium are supplied to the plasma generating region, and a silane gas is supplied to the substrate using a material gas inlet system D4. By this configuration, a silicon oxide film can be formed on the substrate.

Figure 7:
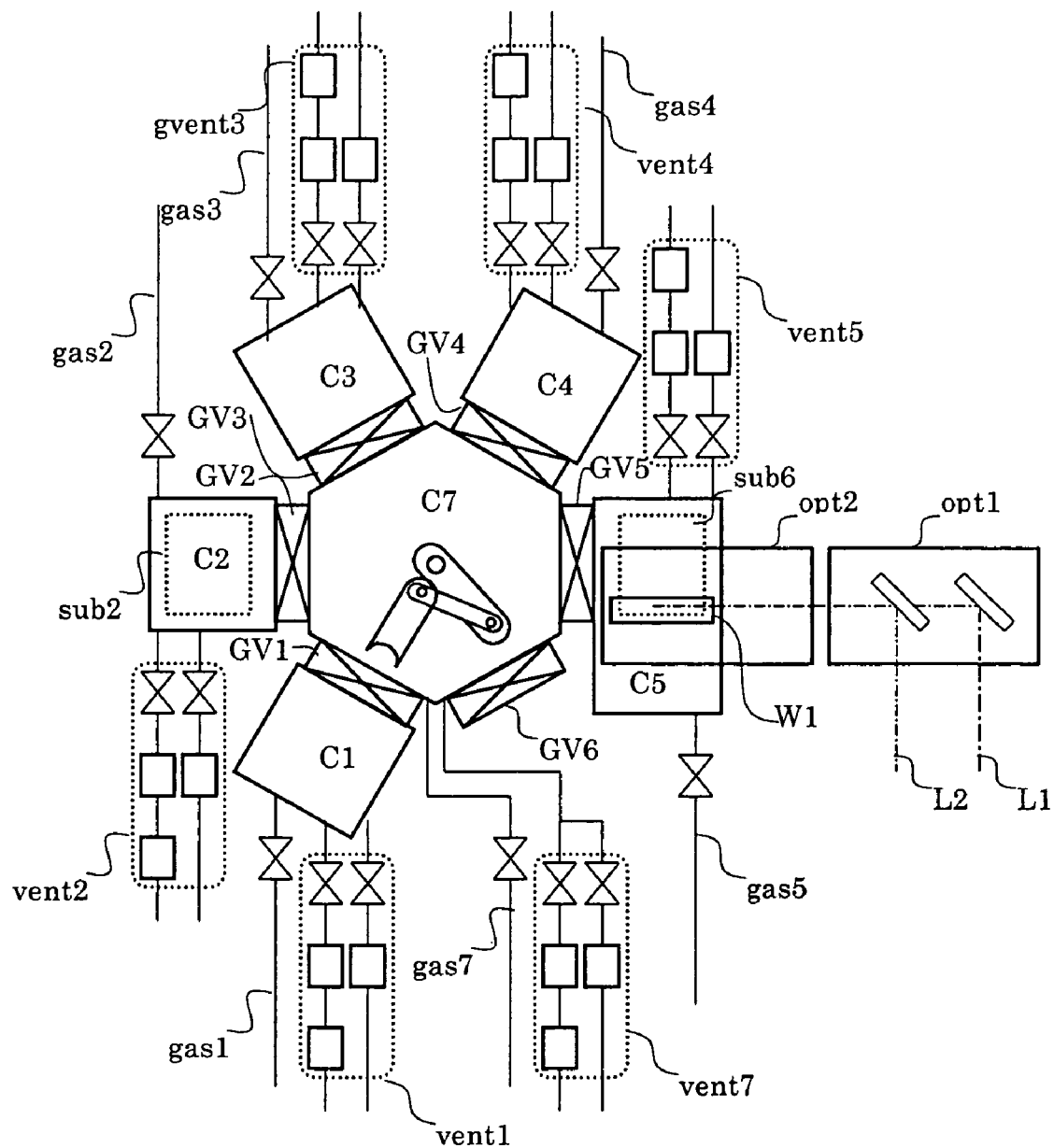
FIG. 7 is a top view of the invented composite system including, for example, an exposure system, transfer chamber, and plasma-enhanced CVD chamber.

FIG. 7 is a top view of another embodiment of the invented semiconductor thin film forming system. A substrate transfer chamber C7 is respectively connected to a load-unload chamber C1, a plasma-enhanced CVD chamber C2, a substrate heating chamber C3, a hydrogen plasma treatment chamber C4, and a laser irradiation chamber C5 via gate valves GV1 through GV6. Laser beams are supplied from a first beam line L1 and a second beam line L2 and are applied to the substrate surface via a laser composing optical system opt1, a laser irradiation optical system opt2, and a laser inlet window W1. Gas supply systems gas1 to gas7, and ventilators vent1 to vent7 are connected to the individual process chambers and the transfer chamber. By this configuration, desired gas species can be supplied, and target process pressures can be set. In addition, the ventilation and degree of vacuum can be controlled. Substrates sub2 and sub6 to be processed are placed horizontally as indicated by dotted lines in the figure.

Figure 8:
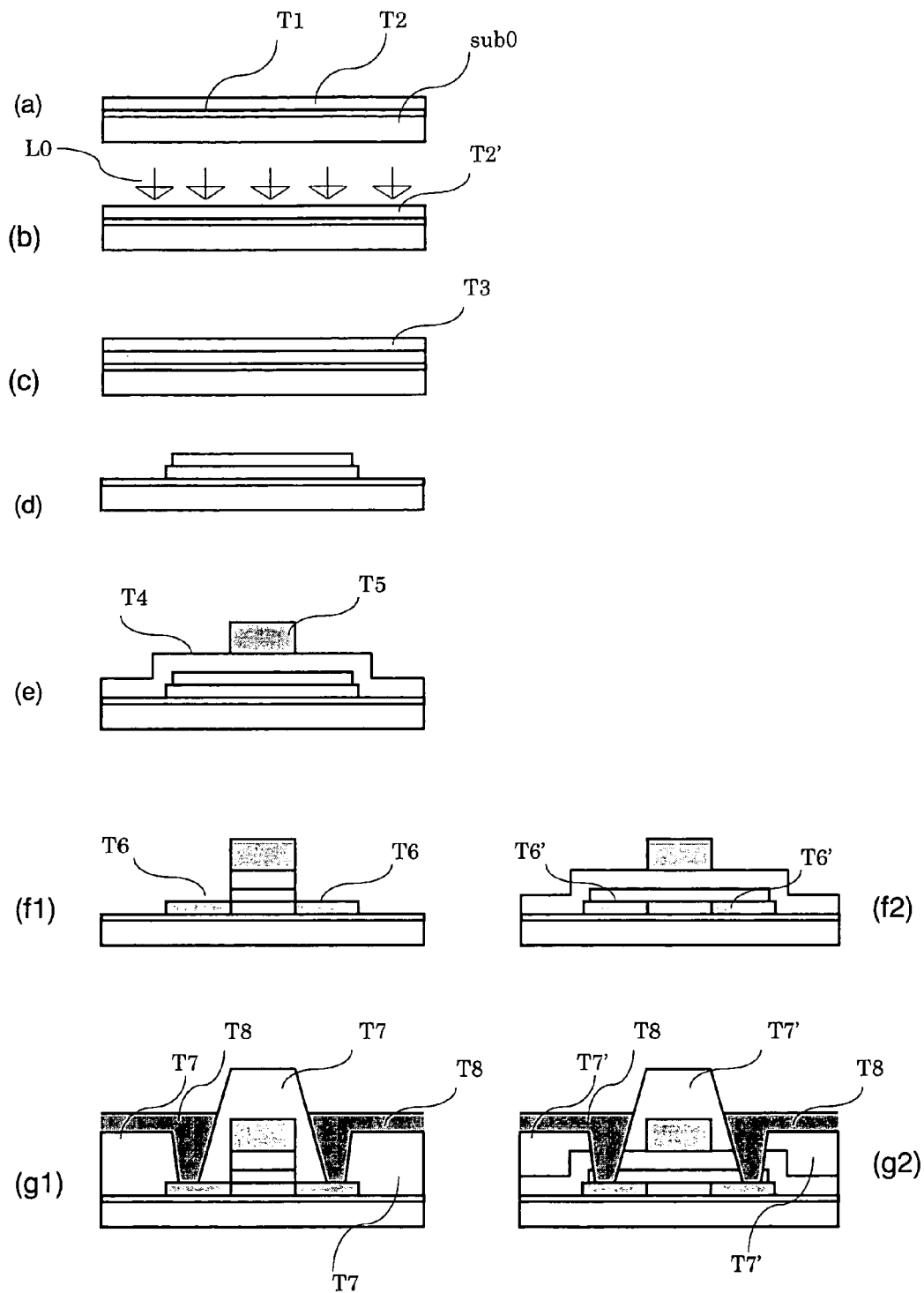
FIG. 8 shows sectional views showing the invented process for producing TFT.

FIG. 8 shows process flow charts showing an application of the invented semiconductor thin film forming system to a production process of thin film transistors. The process includes the following steps.

Figure 17:
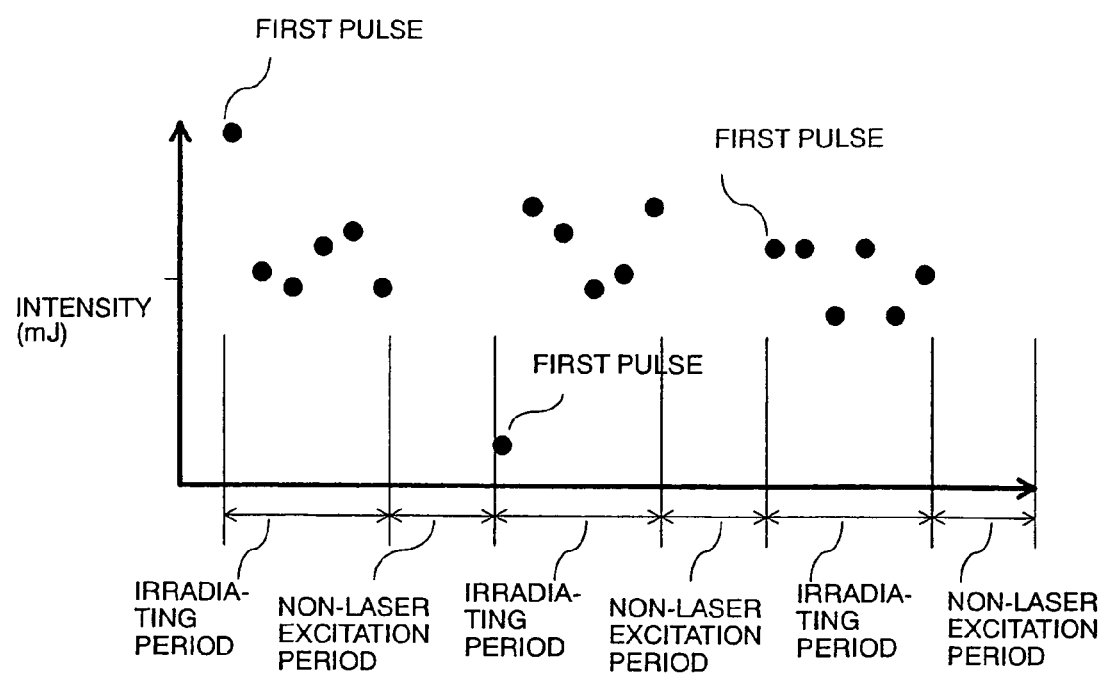
FIG. 17 is a diagram showing the pulse to pulse stability of laser pulse intensities.

(a) A glass substrate sub0 is cleaned to remove organic substance, metals, fine particles and other impurities. Onto the cleaned glass substrate, a substrate covering film T1 and a silicon thin film T2 are sequentially formed. As the substrate covering film, a silicon oxide film is formed to a thickness of 1 µm by low pressure vapor deposition (LPCVD) process at 450° C. with silane and oxygen gases as materials. By using the LPCVD process, the overall exterior surface of the substrate can be covered with a film, except for a region where the substrate is held (this embodiment is not shown in the figure). Alternatively, the process can employ, for example, a plasma-enhanced CVD process using tetraethoxysilane (TEOS) and oxygen as materials, a normal pressure CVD process using TEOS and ozone as materials, or the plasma-enhanced CVD process shown in FIG. 17. An effective substrate covering film includes such a material as to prevent the diffusion of impurities in the substrate material. Such impurities adversely affect semiconductor elements. The substrate may comprise, for example, a glass having a minimized alkali metal concentration or a quartz or glass having a polished surface. The silicon thin film is formed to a thickness of 75 nm by LPCVD at 500° C. with a disilane gas as a material. Under these conditions, the resulting film is to have a hydrogen atom concentration of 1 atomic percent or less, and the film can be prevented from, for example, roughening due to emission of hydrogen in the laser irradiation process. Alternatively, the plasma-enhanced CVD process shown in FIG. 17 or a conventional plasma-enhanced CVD process can be employed. In this case, a silicon thin film having a low hydrogen atom concentration can be obtained by adjusting the substrate temperature or the flow rate ratio of hydrogen to silane or the flow rate ratio of hydrogen to silicon tetrafluoride.

(b) The substrate prepared in Step (a) is subjected to a cleaning process to remove organic substances, metals, fine particles, surface oxide films and other unnecessary matters. The cleaned substrate is then introduced into the invented thin film forming system. The substrate is irradiated with a laser beam L0 to convert the silicon thin film to a crystallized silicon thin film T2'. The laser-induced crystallization is performed in a high purity nitrogen atmosphere of 99.9999% or more at a pressure of 700 Torr or more.

(c) After the completion of Step B, the process chamber is evacuated, and the substrate is then transferred via a substrate transfer chamber to a plasma-enhanced CVD chamber. As a first gate insulating film T3, a silicon oxide film is deposited to a thickness of 10 nm at a substrate temperature of 350° C. from material silane, helium, and oxygen gases. Where necessary, the substrate is then subjected to hydrogen plasma treatment or to heating and annealing. Steps (a) to (c) are conducted in the invented thin film forming system.

(d) Islands composed of laminated silicon thin film and silicon oxide film are then formed. In this step, the etching rate of the silicon oxide film should be preferably higher than that of the silicon thin film according to etching conditions. By forming a stepped or tapered pattern section as illustrated in the figure, gate leakage is prevented, and a thin film transistor having a high reliability can be obtained.

Figure 18:
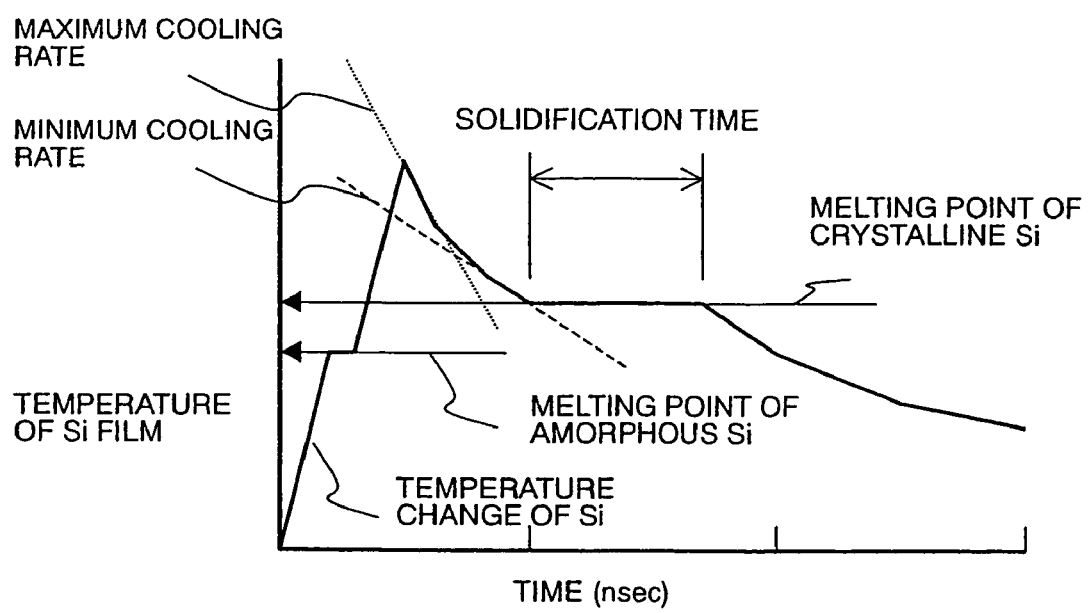
FIG. 18 is a diagram showing an illustrative temperature change of a silicon film.
Figure 19:
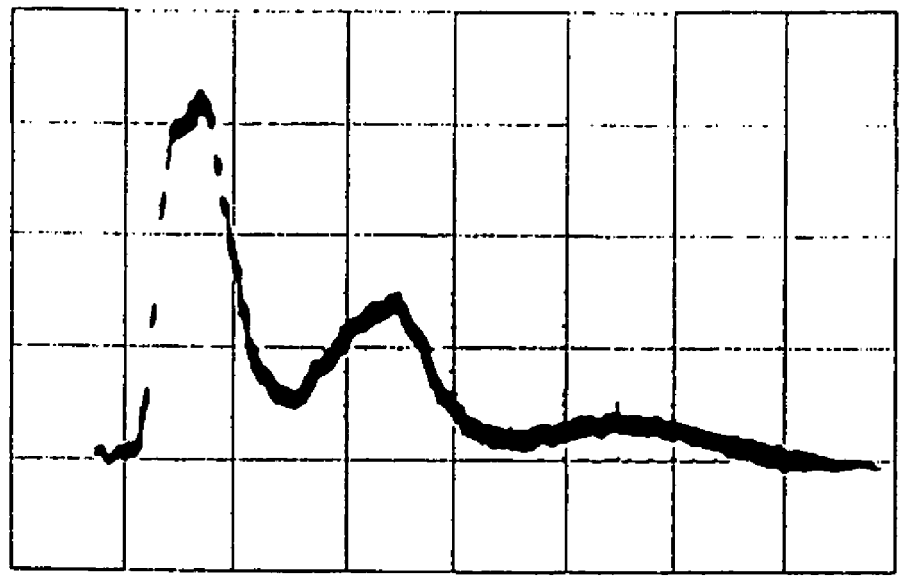
FIG. 19 is a diagram showing an illustrative laser pulse shape.

(e) The substrate is then cleaned to remove organic substances, metals, fine particles and other impurities, and a second gate insulating film T4 is formed to cover the above-prepared islands. In this example, a silicon oxide film 30 nm thick is formed by the LPCVD process at 450° C. from material silane and oxygen gases. Alternatively, the process can employ, for example, the plasma-enhanced CVD process using tetraethoxysilane (TEOS) and oxygen as materials, the normal pressure CVD process using TEOS and ozone as materials, or the plasma-enhanced CVD process as shown in FIG. 18. Next, an $n^+$ silicon film 80 nm thick and a tungsten silicide film 110 nm thick are formed as gate electrodes. The $n^+$ silicon film should be preferably a phosphorus-doped crystalline silicon film formed by the plasma-enhanced CVD process or LPCVD process. The work is then subjected to photolithography and etching processes to yield a patterned gate electrode T5.

(f1, f2) A doping region T6 or T6' is then formed using the gate as a mask. When a complementary metal oxide semiconductor (CMOS) circuit is prepared, an $n^-$ channel TFT requiring an $n^+$ region, and a $p^-$ channel TFT requiring a $p^+$ region are separately formed. The doping technique includes, for example, ion doping where injected dopant ions are not subjected to mass separation, ion injection, plasma-enhanced doping, and laser-enhanced doping. According to the application of the product or the used technique for doping, the surface silicon oxide film is remained as intact or is removed prior to doping (f1, f2).

(g1, g2) An interlayer insulating film T7 or T7' is deposited, and a contact hole is formed, and a metal is deposited thereon. The work is then subjected to photolithography and etching to yield a metallic wiring T8. Such interlayer insulating films include, but are not limited to, a TEOS-based oxide film, a silica coating film, and an organic coating film that can provide a flat film. The contact hole can be formed by photolithography and etching with a metal. Such metals include low resistant aluminium, copper, and alloys made from these metals, as well as tungsten, molybdenum, and other refractory metals. The process including these steps can produce a thin film transistor having high performances and reliability.

Figure 9:
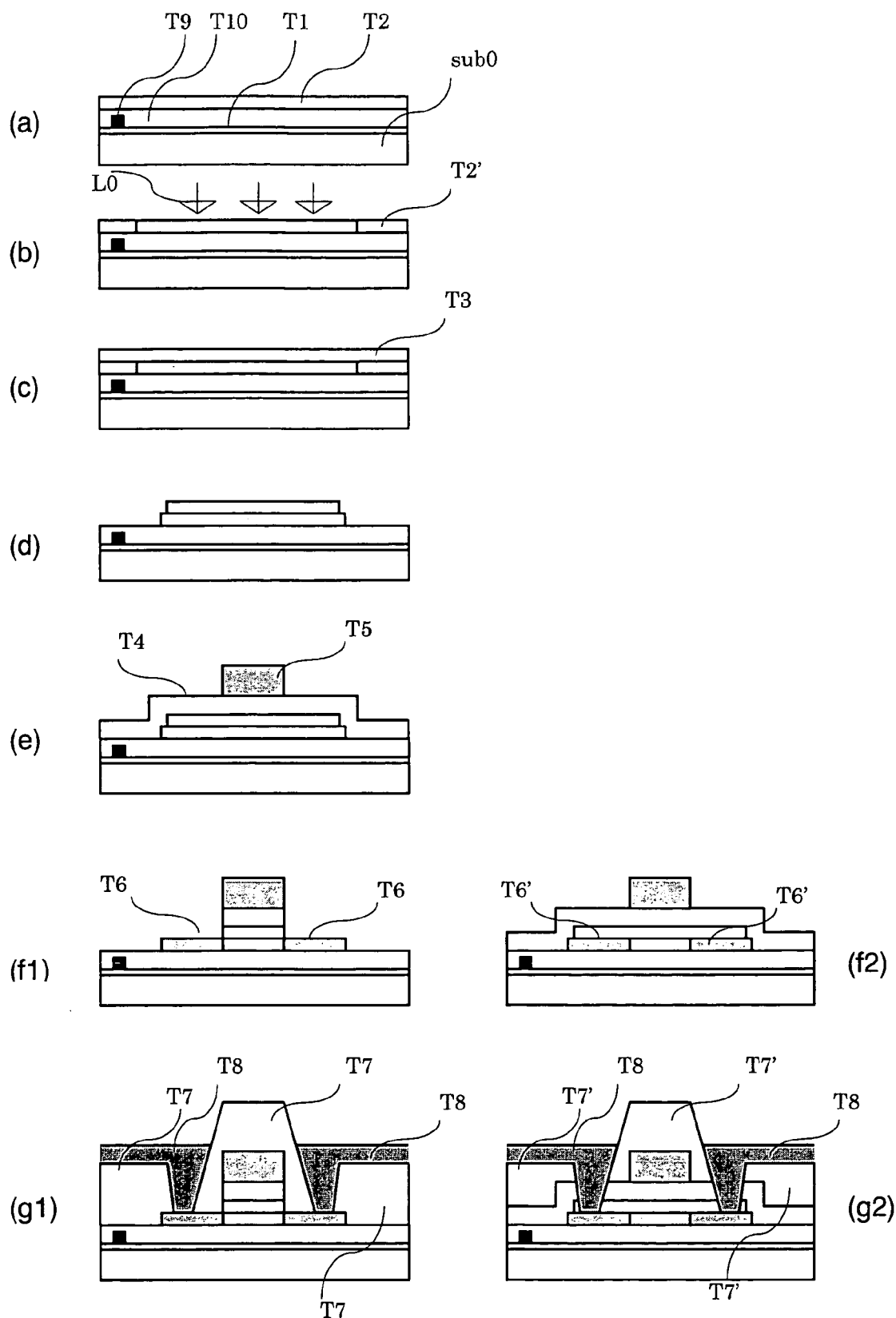
FIG. 9 shows sectional views showing the invented process for producing TFT using alignment mark.
Figure 10:
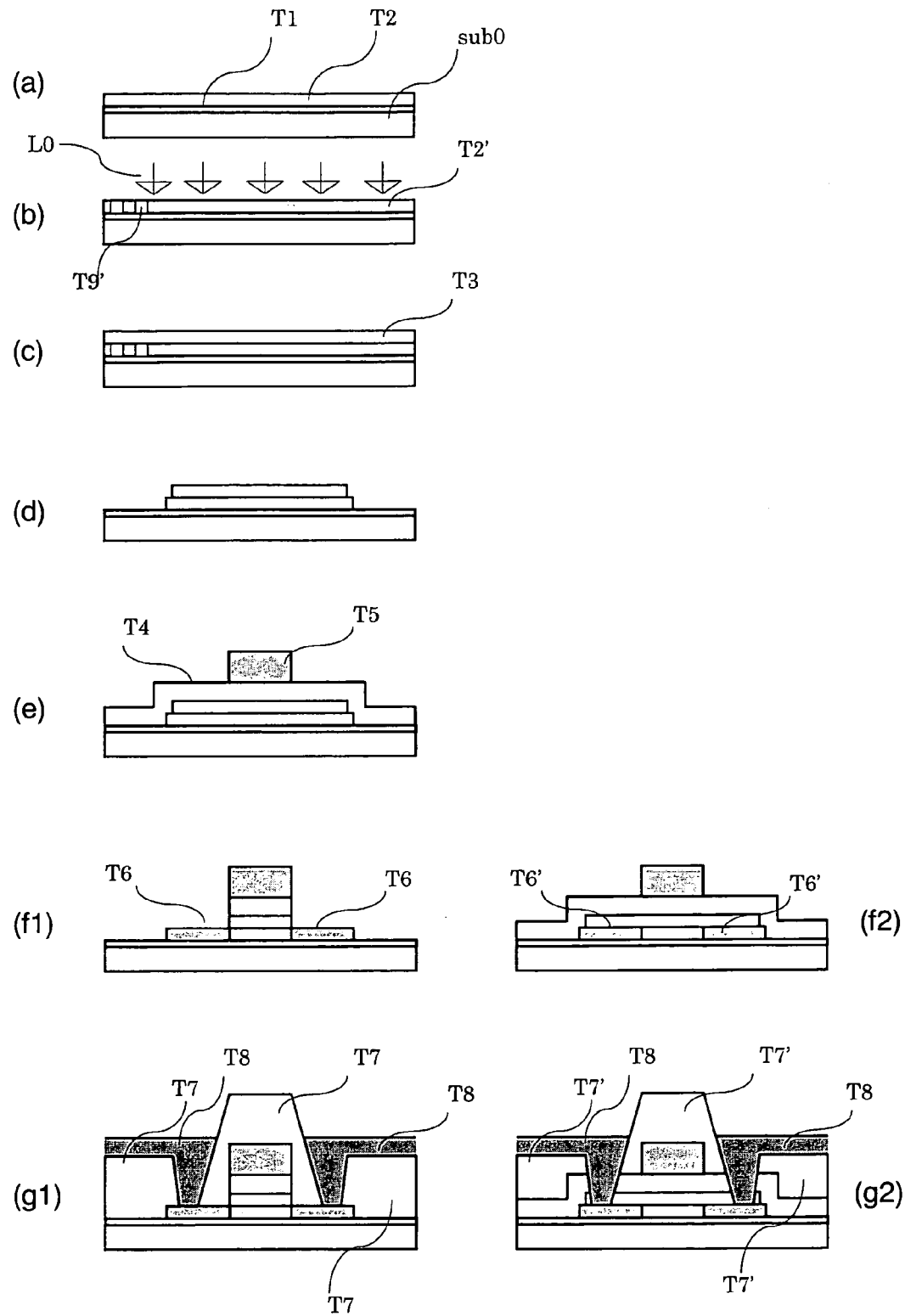
FIG. 10 shows sectional views showing the invented process for producing TFT including the formation of an alignment mark.

FIG. 9 illustrates an embodiment where an alignment mark is previously formed and laser irradiation is performed with reference to the alignment mark. FIG. 10 illustrates another embodiment where an alignment mark is formed concurrently with laser irradiation. These embodiments are based on the TFT manufacture process flow, and are basically similar to the process shown in FIG. 8. The distinguishable points of these embodiments are described below.

In FIG. 9($a$), a glass substrate sub0 is cleaned to remove organic substances, metals, fine particles, and other undesired matters. On the cleaned substrate, a substrate covering film T1 and a tungsten silicide film are sequentially formed. The work is then patterned by photolithography and etching to form an alignment mark T9 on the substrate. A mark protective film T10 is formed to protect the alignment mark, and a silicon thin film is then formed.

In FIG. 9($b$), upon laser light exposure, a target region is exposed to light with reference to the alignment mark. The alignment in the successive step can be performed with reference to the preformed alignment mark or to an alignment mark formed by crystallized silicon thin film patterning (not shown).

In FIG. 10($b$), a crystallized alignment mark T9' is formed concurrently with laser irradiation to the silicon thin film. The crystallized alignment mark is formed by utilizing a difference in modification between an exposed region and a nonexposed region.

In FIG. 10($d$), alignment in the photolithography process is performed by using the crystallized alignment mark T9'. The work is then subjected to an etching process to form islands composed of laminated silicon thin film and silicon oxide film.

The description has thus been made for the embodiment of the optical source utilizing the excimer laser such as XeCl, KrF, XeF, ArF or the like, however, various other kinds of laser such as YAG laser, carbon dioxide laser, or the semiconductor laser with the pulse emission can be used. The embodiment is applicable not only to the silicon semiconductor thin film but also to the formation of the crystal thin film and the forming apparatus therefor.

INDUSTRIAL APPLICABILITY

According to the present invention, in the case where the irradiation intensity is increased so as to obtain the crystallized structure of a better quality, it is possible to prevent the crystal becoming microcrystalline or amorphous. Therefore, a technique is provided for forming the silicon thin film with a small trap state density by the energy beam irradiation such as optical irradiation. A technique is also provided for applying the technique on the substrate with a large surface and a semiconductor device therefor. A device for manufacturing the electric field effective transistor utilizing silicon of a good quality, i.e. with an efficient characteristic can be provided.

In the crystallization utilizing the fine beam which is controlled to the micron order, a crystal growth length by a single unit pulse has been increased twice as the conventional technique.

The invention claimed is:

1. A thin film processing method of processing a thin film by irradiating an optical beam onto a thin film, wherein:
one unit of irradiation of the optical beam includes irradiations due to first and second optical pulses onto the thin film,
the thin film is processed by repeating the one unit of irradiation,
each of the first and the second optical pulse has different pulse waveforms,
the first optical pulse and the second optical pulse are supplied from respective, separate first and second optical pulse sources, and
said thin film is positioned in position relative to said first and second optical pulse sources for each said unit of irradiation,
wherein
the first and second optical pulses control a cooling rate to $1.6 \times 10^{10}$° C. or less which prevents the thin film from becoming microcrystalline or amorphous and can satisfactorily grow the crystal size of the thin film.

2. A thin film processing method as claimed in claim 1, wherein:
the one unit of irradiation includes the first optical pulse irradiation to the thin film and the second optical pulse irradiation to the thin film which substantially starts simultaneously with the irradiation of the first pulse.

3. A thin film processing method as claimed in claim 2, wherein:
a relationship between the first and the second pulse satisfies that a pulse width of the first optical pulse is smaller than a pulse width of the second optical pulse and an irradiation intensity of the first optical pulse is not lower than an irradiation intensity of the second optical pulse.

4. A thin film processing method as claimed in claim 1, wherein:
the one unit of irradiation includes the first optical pulse irradiation to the thin film and the second optical pulse irradiation to the thin film which substantially starts with a delay to the first optical pulse irradiation.

5. A thin film processing method of processing a thin film by irradiating an optical beam onto a thin film, wherein:
one unit of irradiation of the optical beam includes irradiations due to first and second optical pulses onto the thin film,
the thin film is processed by repeating the one unit of irradiation,
the first optical pulse and the second optical pulse are supplied from respective, separate first and second optical pulse sources, and
said thin film is positioned in position relative to said first and second optical pulse sources for each said unit of irradiation,
wherein the one unit of irradiation includes the first optical pulse irradiation to the thin film and the second optical pulse irradiation to the thin film which substantially starts with a delay to the first optical pulse irradiation,
the delay is variable in order to control a cooling rate to a predetermined value, and
wherein the first and second optical pulses control the cooling rate to $1.6 \times 10^{10}$° C. or less which prevents the thin film from becoming microcrystalline or amorphous and can satisfactorily grow the crystal size of the thin film.

6. A thin film processing method of processing a thin film by irradiating an optical beam onto a thin film, wherein:
one unit of irradiation of the optical beam includes irradiations due to first and second optical pulses onto the thin film,
the thin film is processed by repeating the one unit of irradiation,
the first optical pulse and the second optical pulse are supplied from respective, separate first and second optical pulse sources, and
said thin film is positioned in position relative to said first and second optical pulse sources for each said unit of irradiation,
wherein the one unit of irradiation includes the first optical pulse irradiation to the thin film and the second optical pulse irradiation to the thin film which substantially starts simultaneously with the irradiation of the first pulse, and
wherein the first and second optical pulses control a cooling rate to $1.6 \times 10^{10}$° C. or less which prevents the thin film from becoming microcrystalline or amorphous and can satisfactorily grow the crystal size of the thin film.

7. A thin film processing method as claimed in claim 1, wherein a relationship between the first and second pulse satisfies:
(a pulse width of the first optical pulse)<(a pulse width of the second optical pulse).

8. A thin film processing method as claimed in claim 7, wherein
the relationship between the first and the second pulse satisfies
(the irradiation intensity of the first optical pulse)$\geq$(the irradiation intensity of the second optical pulse).

* * * * *